United States Patent [19]
Lee

[11] Patent Number: 5,757,618
[45] Date of Patent: May 26, 1998

[54] EXPANSION BOARD MOUNTING STRUCTURE FOR COMPUTERS

[75] Inventor: Sang-Jin Lee, Suwon-si, Rep. of Korea

[73] Assignee: SamSung Electronics Co., Ltd., Suwon, Rep. of Korea

[21] Appl. No.: 811,941

[22] Filed: Mar. 5, 1997

[30] Foreign Application Priority Data

Mar. 27, 1996 [KR] Rep. of Korea ............ 1996-8520

[51] Int. Cl.$^6$ ........................ H05K 7/12
[52] U.S. Cl. .............. 361/686; 361/737; 361/740; 361/759; 361/788; 361/801; 361/802; 361/825; 439/377; 439/631
[58] Field of Search ............ 361/683, 684, 361/686, 732, 737, 740, 741, 747, 752, 756, 759, 785, 788, 796, 801, 802, 825; 312/223.2; 439/61, 62, 64, 296, 327, 374, 377, 378, 372, 553, 555, 571, 572, 631, 633, 929

[56] References Cited

U.S. PATENT DOCUMENTS

| | | | |
|---|---|---|---|
| 3,767,974 | 10/1973 | Donovan, Jr. et al. | 361/798 |
| 4,002,381 | 1/1977 | Wagner et al. | 361/801 |
| 4,151,580 | 4/1979 | Struger et al. | 361/801 |
| 4,517,625 | 5/1985 | Frink et al. | 361/755 |
| 4,592,610 | 6/1986 | Bowls | 439/377 |
| 4,758,928 | 7/1988 | Wierec et al. | 361/801 |
| 5,030,108 | 7/1991 | Babow et al. | 439/64 |
| 5,140,501 | 8/1992 | Takahashi et al. | 361/798 |
| 5,191,513 | 3/1993 | Sugiura et al. | 361/752 |
| 5,218,519 | 6/1993 | Welch et al. | 361/801 |
| 5,317,483 | 5/1994 | Swindler | 361/801 |
| 5,402,319 | 3/1995 | Shumaker et al. | 361/796 |
| 5,467,254 | 11/1995 | Brusati et al. | 361/799 |
| 5,535,100 | 7/1996 | Lubahn et al. | 361/801 |
| 5,546,282 | 8/1996 | Hill et al. | 361/796 |
| 5,564,930 | 10/1996 | Yu | 361/686 |
| 5,575,546 | 11/1996 | Radloff | 361/686 |
| 5,576,935 | 11/1996 | Freer et al. | 361/785 |
| 5,594,627 | 1/1997 | Le | 361/801 |
| 5,601,349 | 2/1997 | Holt | 361/686 |

*Primary Examiner*—Leo P. Picard
*Assistant Examiner*—John B. Vigushin
*Attorney, Agent, or Firm*—Robert E. Bushnell, Esq.

[57] ABSTRACT

An expansion board mounting structure that securely fastens expansion cards within the chassis of a computer is provided. A receptacle is positioned on an interior wall of the computer chassis. The receptacle contains vertical slots into which inserts, connected to expansion cards are inserted. The expansion cards are mechanically attached to the computer chassis at the receptacle found in the rear wall of the computer. Electrical connection is made in the board connecting portion found at the bottom of the computer chassis. The final assembly step requires that a cover be placed over the tops of the vertical slots. This requires the cover to be fastened to the receptacle containing the vertical slots. This attachment of the cover to the receptacle is accomplished without the use of screws or threaded fasteners.

17 Claims, 8 Drawing Sheets

EXPANSION BOARD MOUNTING STRUCTURE FOR COMPUTERS

CLAIM OF PRIORITY

This application makes claims all benefits accruing under 35 U.S.C. §119 from an application for Expansion Board Mounting Structure for Computers earlier filed in the Korean Industrial Property Office on 27 Mar. 1996 and there duly assigned Ser. No. 8520/1996.

BACKGROUND OF THE INVENTION

The present invention relates to an expansion board mounting structure for computers, and more particularly, to an expansion board mounting structure for computers which allows for the mounting of expansion boards having special functions, without the use of screws.

Generally, functions not included in the main board (for example, graphics, sound functions, modem, mpeg, etc.) can be added by installing expansion boards, having circuits that perform special functions, to slots fixed in a main body of a computer. The expansion boards are also referred to as expansion cards, and the different kinds of expansion cards include graphic cards, sound cards, modem cards, mpeg cards, etc.

Easy to install expansion boards is not new in the art. For example, U.S. Pat. No. 5,317,483 for a *Computer Expansion Card Support Structure* to Swindler discloses a locking bar that is placed over the left end edges of expansion cards, locking them into position. The locking bar acts as a cover for the guide grooves into which the ends of the expansion cards are inserted into. The locking bar serves to keep dust and dirt out of the guide grooves. In Swindler, a retaining screw is used to fasten the bar to a threaded ledge opening.

U.S. Pat. No. 5,535,100 for a *Snap-Together/Quick-Release Fastening Assembly For Supporting A Circuit Card* to Lubahn et al. discloses a fastening assembly which fastens together an expansion board to a computer. A fastening pin connects a daughter board to a mother board via a connector. However, the expansion board does not slide into guide grooves in Lubahn et al., rendering Lubahn et al. dissimilar to Swindler.

What is needed is computer expansion card support structure similar to that disclosed by Swindler '483 but that does not require screws or threaded fasteners to attach the cover to the groove containing receptacles. Without the use of threaded fasteners, installation of the expansion cards becomes a much more simple task.

SUMMARY OF THE INVENTION

To solve the above problems, it is an object to provide an expansion board mounting structure for computers which secures, without threaded fasteners, the cover to the guide groove containing receptacle without the use of screws or threaded fasteners.

This and other objects may be solved by a receptacle positioned on an interior wall of the computer chassis. The receptacle contains vertical slots into which inserts, connected to expansion cards, are inserted. The expansion cards are mechanically attached to the computer chassis at the receptacle found in the rear wall of the computer. Electrical connection is made in the board connecting portion found at the bottom of the computer chassis. A cover is finally placed over the receptacle containing the guide grooves containing the expansion cards attached to their respective inserts. The attachment of the cover to the groove containing receptacle are made without the use of screws or threaded fasteners, thus simplifying the installation and disassembly process.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 10:
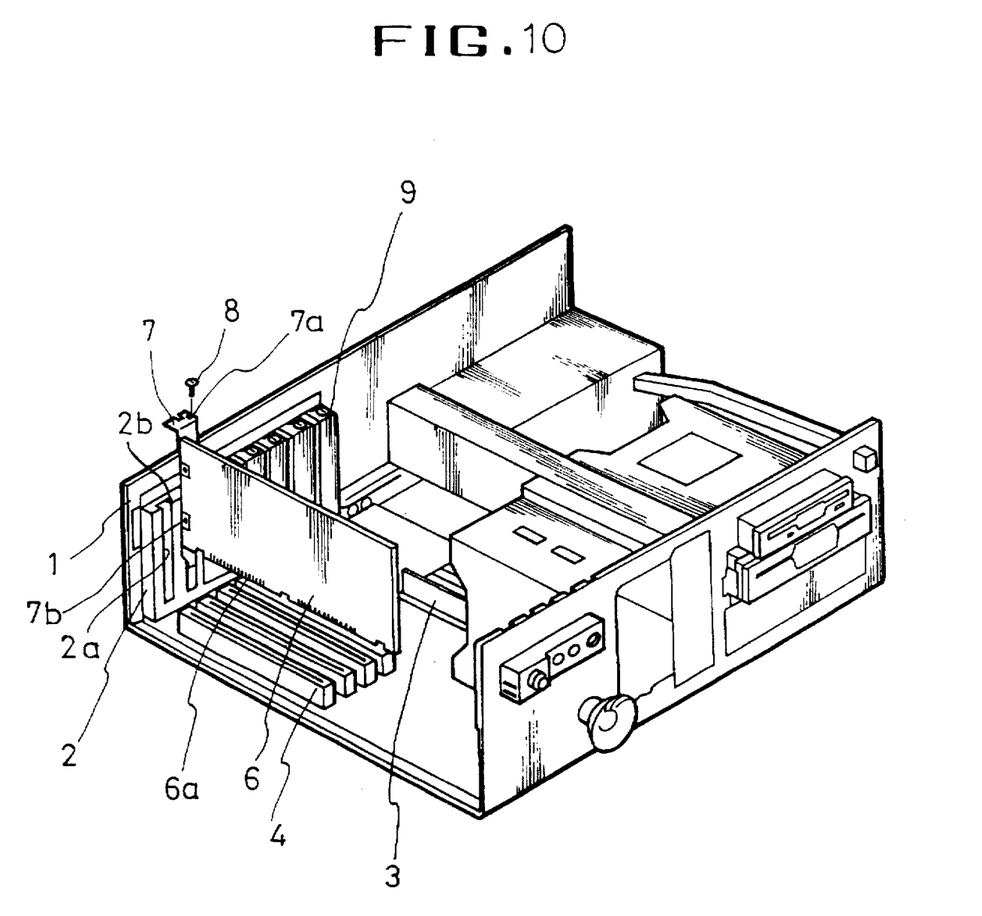
FIG. 10 is a perspective view illustrating an expansion board mounted to a computer having an earlier version for expansion board mounting structures for computers.

As shown in FIG. 10, the earlier expansion board mounting structure for a computer is made of a fixed member 2, installed on a main body 1, a plurality of board connecting parts 4, fixed on the main body 1 and electrically connected to a main board 3, an expansion board 6 having a lead end portion 6a, joined with and electrically connected to the board connecting part 4, a support member 7, joined with the expansion board 6 and receptacle 2, and which fixes and supports the expansion board 6, and a plurality of small screws 8 to attach support member 7 to receptacle 2.

The receptacle 2, installed on the main body 1, is installed on an inside face of the main body 1, and has formed a plurality of guide grooves 2a, into which the support member 7 is inserted, and a plurality of joining holes 2b, in which the small screws 8 are screwed into. The support member 7 is fixed on the side of the main body 1 such that it maintains a fixed distance with regard to the board connecting part 4 (the same spacing as that with the support member 7 and the lead end portion 6a).

A variety of different types of board connecting parts 4, fixed on the main body 1, and lead end portions 6a, formed on the expansion board 6, are used including ISA, VESA, PCI, etc. However, both the board connecting parts 4 and the lead end portions 6a must be of the same type.

The support member 7 is plate-shaped having a width larger than that of the guide groove 2a formed on the receptacle 2. One end of the support member 7 is bent, and the other end is narrow to allow insertion into the guide groove 2a of the receptacle 2. A joining groove 7a is formed in the bent end of the support member 7 and it is located opposing the joining hole 2b, to allow insertion of the small screws 8. Also, board joining parts 7b that join with the expansion board 6 are formed in the support member 7. The board joining parts 7b of the support member 7 are formed extended and then bent from the support member so they are flush with the expansion board 6, and a fixing holes are formed in the board joining parts 7b.

Generally, guide groove covers 9, shaped similar to the support member 7, are mounted to the guide grooves 2a of the receptacle 2 in which expansion boards 6 are not mounted. The guide groove covers 9 prevent foreign substances, including dust, from entering the guide grooves 2a. Also, the support member 7 generally is joined with the expansion board 6. That is, small screws are inserted through the board joining parts 7b of the support member 7 then screwed into holes formed in the expansion board 6, integrally assembling the expansion board 6 and support member 7.

In the earlier computer expansion board mounting structure formed as in the above, when mounting the expansion board 6 to the main body 1, one of the guide groove covers 9 is removed from the receptacle 2 by detaching its small screw 8, the narrow end portion of the support member 7 joined with the expansion board 6 is inserted in the guide groove 2a of the receptacle 2, the lead end portions 6a of the expansion board 6 is carefully matched with then inserted into the board connecting part 4, and, next, the small screw 8 is passed through the joining groove 7a of the support member 7 and screwed into the joining hole 2b of the receptacle 2.

As in the above, the expansion board 6 is securely fixed to the receptacle 2, mounted to the main body 1, through the use of the small screw 8, and the expansion board 6 and main board 3 are electrically connected through the lead end portion 6a of the expansion board 6 and board connecting part 4. In the above computer expansion board mounting structure, as the small screws 8 must be removed and then re-screwed every time an expansion board 6 is mounted, the mounting process is cumbersome and time consuming. Also, if the small screws 8 are lost, it is not possible to securely mount additional expansion boards 6.

Referring to FIGS. 1–4, an expansion board mounting structure for computers according to the first embodiment of the present invention includes a receptacle 16, installed in a computer main body 10 and having a plurality of guide grooves 17. A plurality of board connecting parts 14 are fixed to the main body 10 and electrically connected to a main board 11. An expansion board 20 is electrically connected to the board connecting part 14 through the connection of lead end portions 22 formed on the expansion board 20. A support member 26, joined with the expansion board 20, fits into guide groove 17 of receptacle 16. A cover member 30 joins with the top end of receptacle 16.

Figure 1:
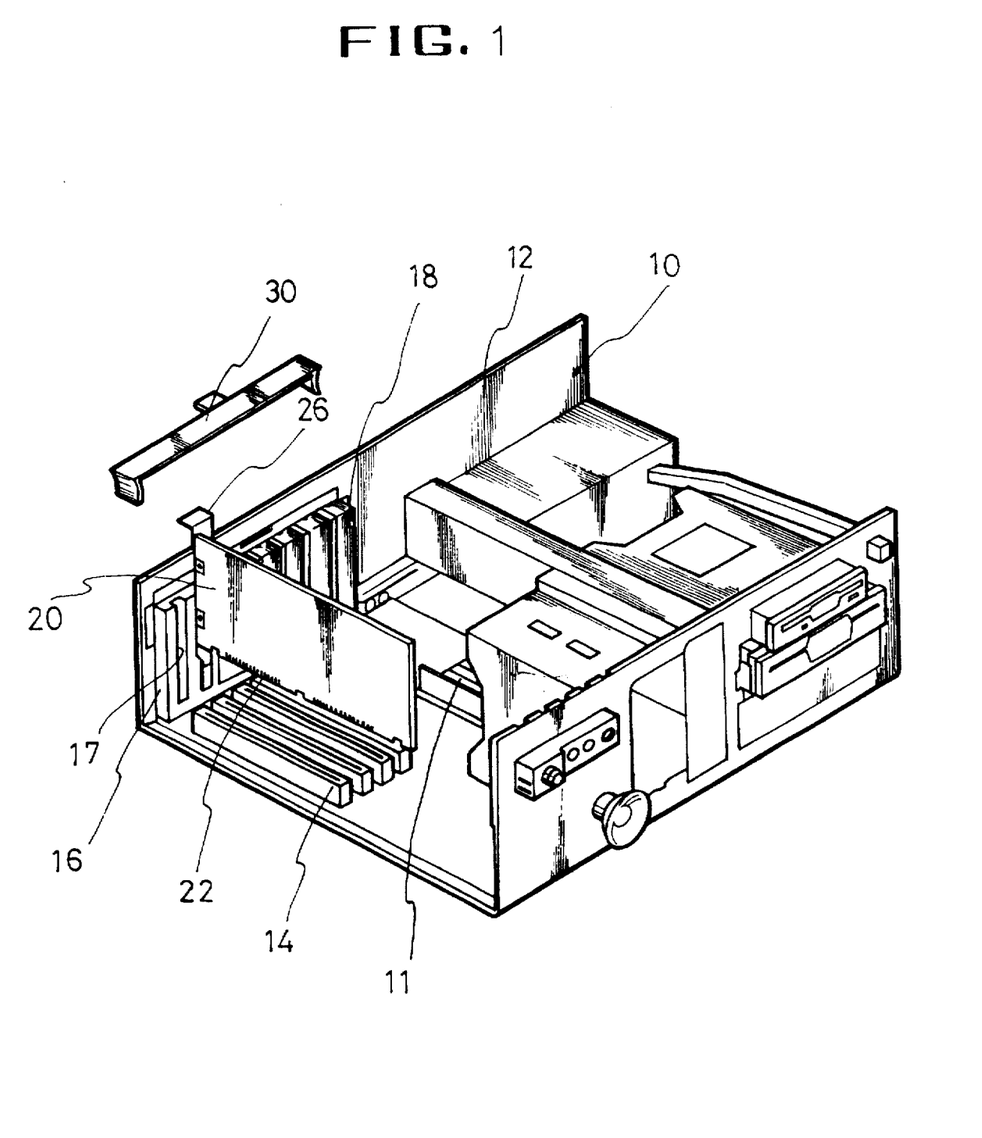
FIG. 1 is a perspective view illustrating an expansion board mounted to a computer having an expansion board mounting structure for computers in accordance with the first embodiment of the present invention.
Figure 2:
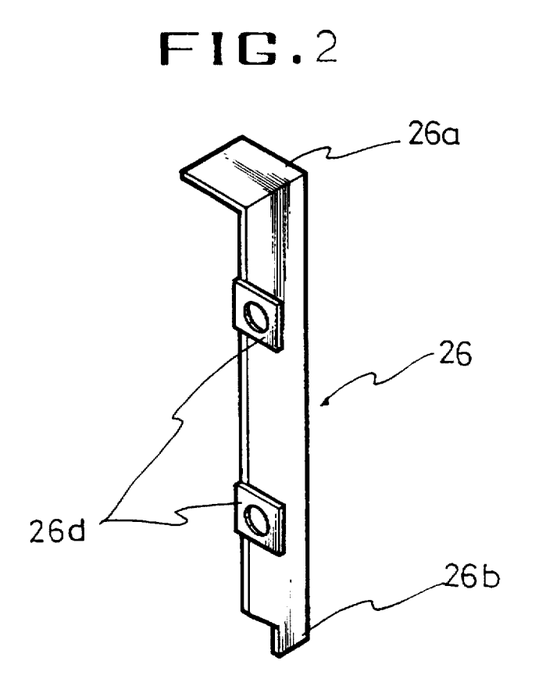
FIG. 2 is a perspective view illustrating a support member in accordance with the first embodiment of the present invention.

As illustrated in FIG. 2, the support member 26 is formed so that it is flat and so that its width is larger than that of the guide groove 17, formed in the receptacle 16. An end portion 26a is bent and its other end portion 26b is formed so that it is more narrow than the guide groove 17 of the receptacle 16 so that it is able to be inserted into the guide groove 17. Also, board joining parts 26d are formed in the support member 26. In the present invention, although the board joining parts 26d are formed extending and then bent from the support member 26 having holes for fixing the expansion board 20, the support member 26 can also be structured such that it is itself bent and having the holes formed along its width portion.

The support member 26 is assembled to the expansion board 20. Namely, small screws are placed through the holes of the board joining parts 26d in the support member 26 and then screwed into the holes of the expansion board 20 to integrally join the support member 26 and expansion board 20.

Figure 3:
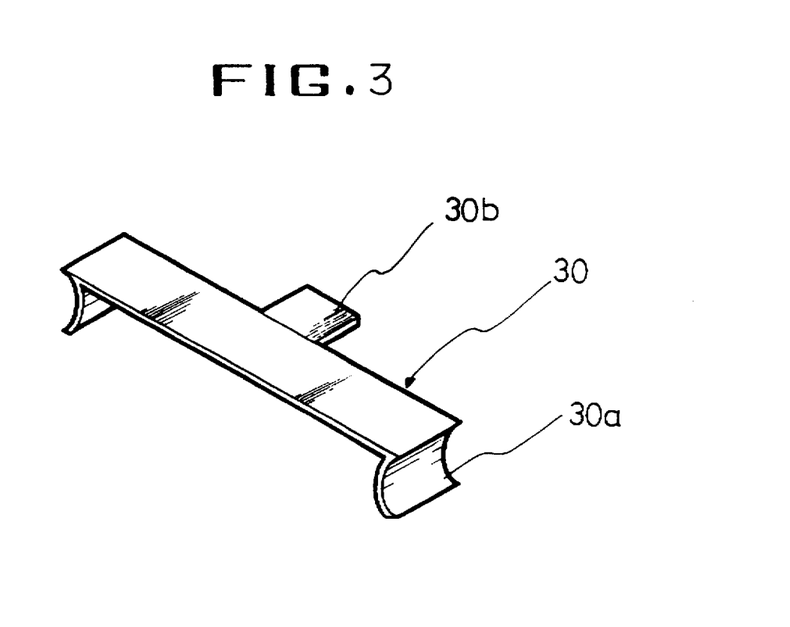
FIG. 3 is a perspective view illustrating a cover member according to the first embodiment of the present invention.

As shown in FIG. 3, the cover member 30 is formed having two side plates 30a possessing a fixed amount of elastic tension toward the center of the cover member 30. Also, a protrusion 30b is formed perpendicular to the length of the cover member and in a location such that the cover member 30 can maintain its joined position with the receptacle 16.

Figure 4:
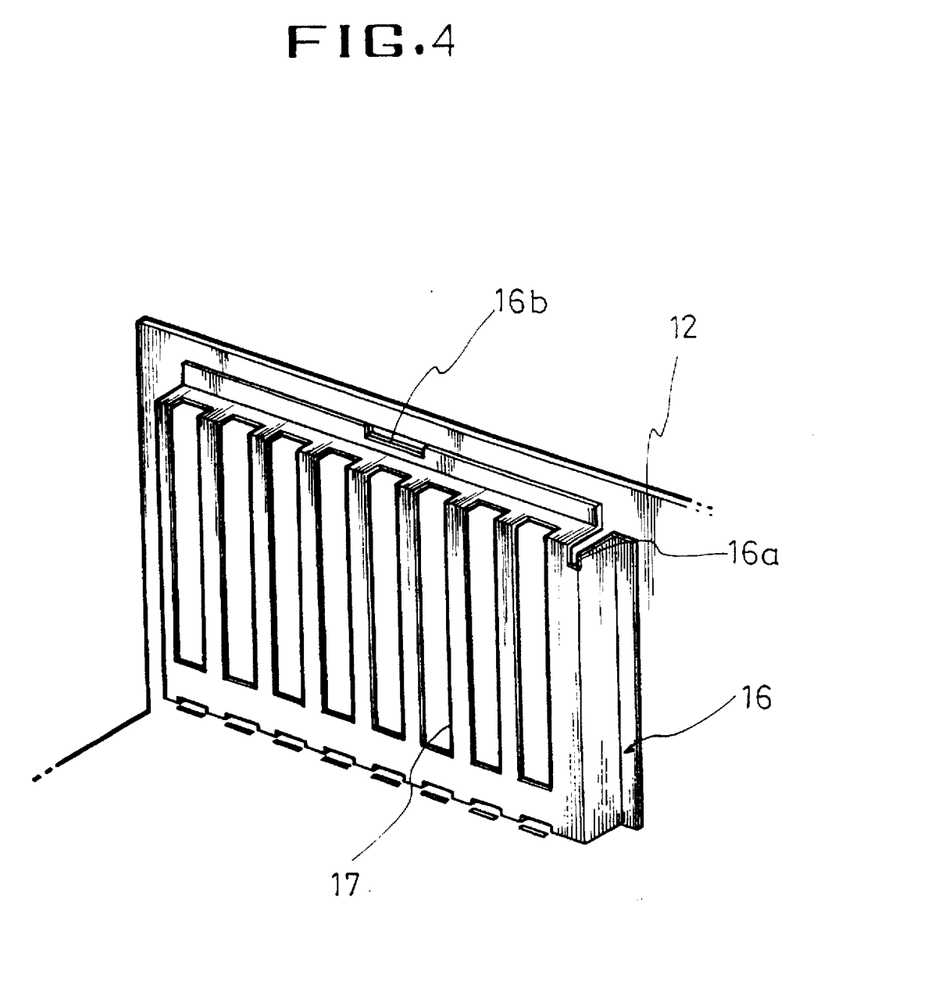
FIG. 4 is a perspective view of a receptacle installed in a main body in according to the first embodiment of the present invention.

As appears in FIG. 4, the receptacle 16, in which a plurality of guide grooves 17 are formed, is mounted to a side plate 12 of the main body 10. The receptacle 16 has insertion grooves 16a to allow for the insertion of the side plates 30a of the cover member 30, and a receptacle aperture 16b for the insertion of the protrusion 30b of the cover member 30.

Figure 5:
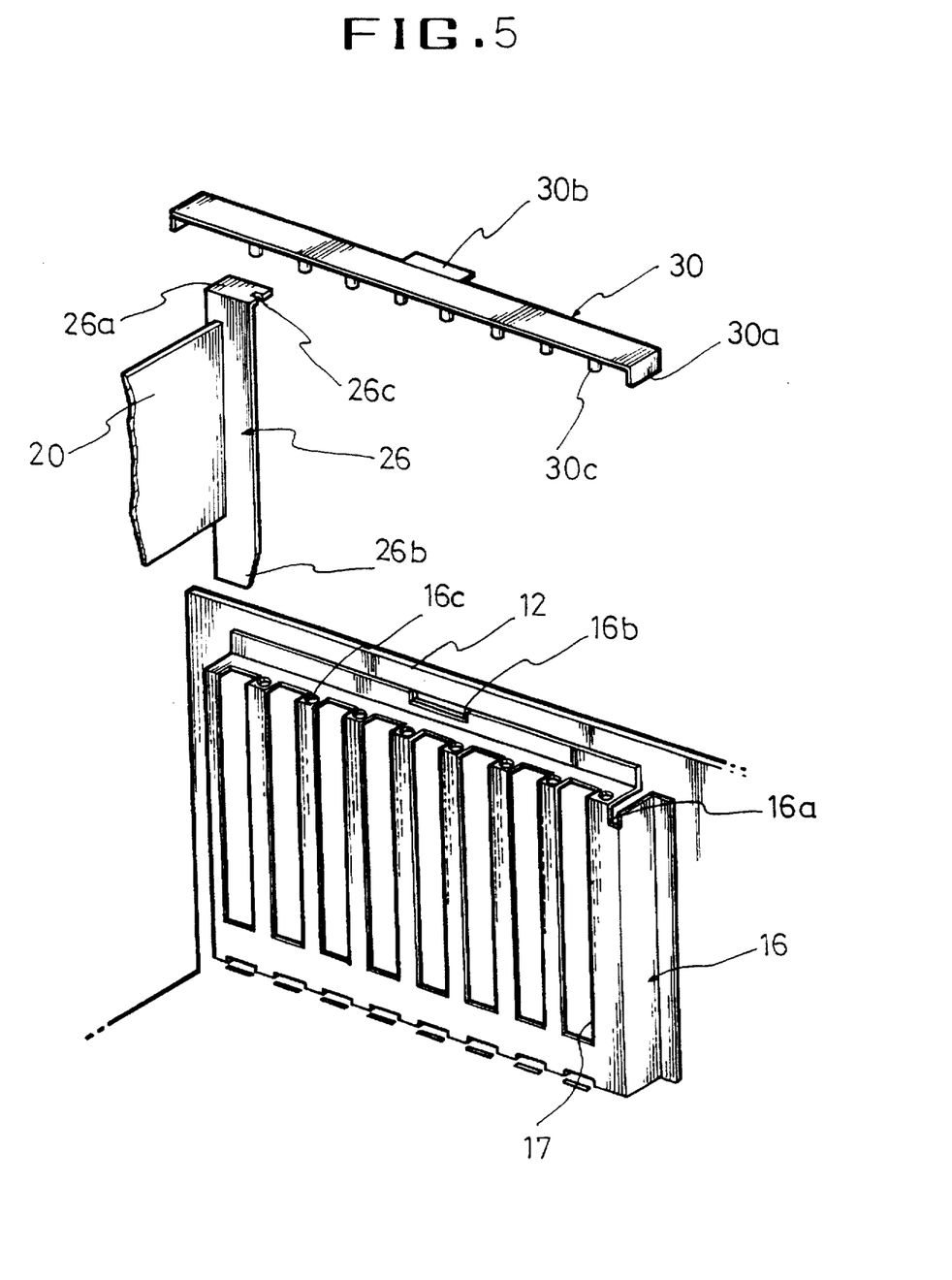
FIG. 5 is a partial assembly perspective view illustrating an expansion board mounting structure for computers according to the second embodiment of the present invention.

FIG. 5, illustrates an expansion board mounting structure according to the second embodiment of the present invention. Fixing protrusions 30c are formed on the cover member 30, extending in the direction of the side plates 30a. Protrusion holes 16c are formed in the receptacle to allow for the insertion of the fixing protrusions 30c. Furthermore, support member grooves 26c are formed in the support member 26 for the fixing protrusions 30c to insert into.

In the second embodiment shown in FIG. 5, although the number of fixing protrusions 30c is equal to the number of expansion boards 20 that can be mounted to the main body 10, there does not necessarily need to be a corresponding number, and the cover member 30 can be formed having a smaller number of fixing protrusions 30c.

Figure 6:
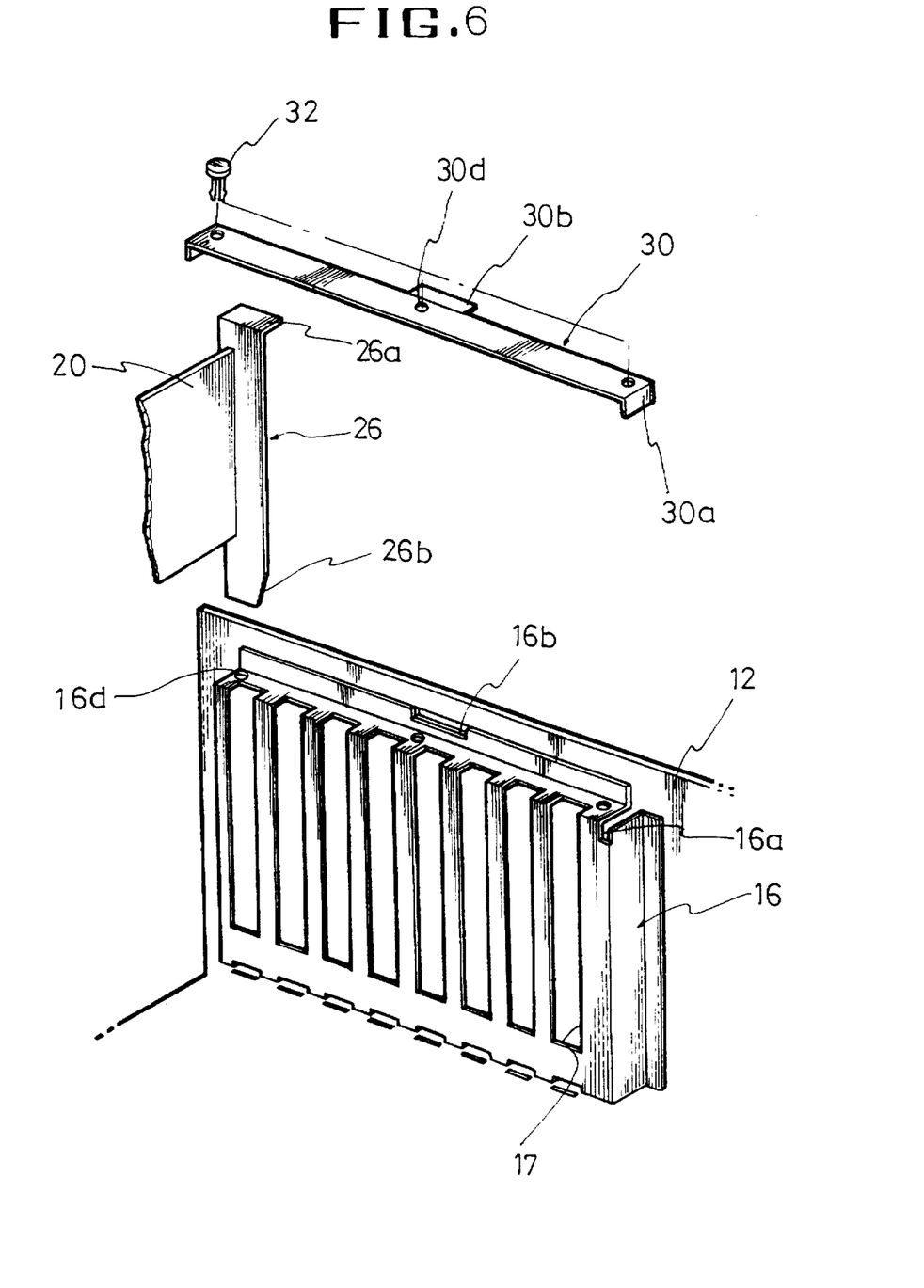
FIG. 6 is a partial assembly perspective view illustrating an expansion board mounting structure for computers according to the third embodiment of the present invention.

In addition, in FIG. 6, illustrating an expansion board mounting structure according to the third embodiment of the present invention, fasteners 32 are further included, and one or more fastener hole 30d is formed in the cover member 30 to allow for the insertion of the fasteners 32. Furthermore, one or more fastener lock hole 16d is formed in the receptacle 16 for the insertion and securing of the ii fasteners 32.

Figure 9:
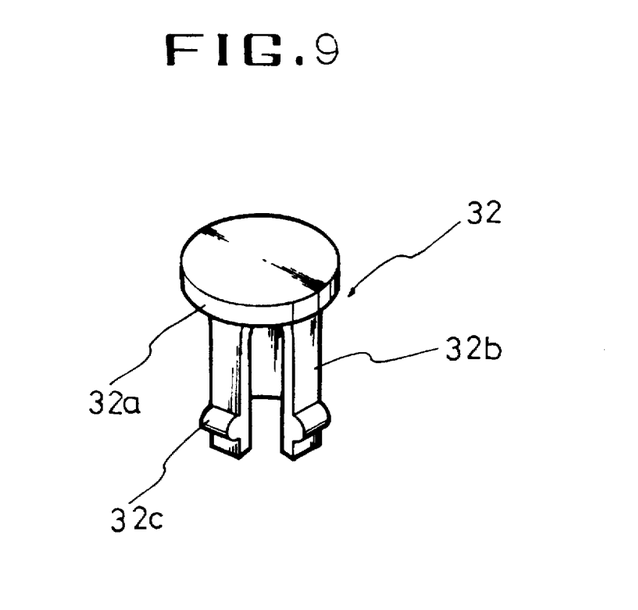
FIG. 9 is a perspective view illustrating a fastener in accordance with the third and the fourth embodiments of the present invention.

As shown in FIG. 9, the fasteners 32 include a head portion 32a formed for easy grasping, an insertion portion 32b for insertion into the fastener holes 30d of the cover member 30 and into the fastener lock holes 16d of the receptacle 16, and a locking portion 32c, formed on the lower part of the insertion portion 32b and projecting outward in a half circle for maintaining a secure fixed position in the fastener lock holes 16d. The insertion portion 32b are divided into many parts in a lengthwise direction. Also, the fasteners 32 are formed of a material having elasticity, and, thus, when being inserted in the fastener hole 30d or the fastener lock hole 16d, they compress, and before and after insertion, the fasteners 32 maintain an expanded state. It is preferable that the fasteners 32 are provided in a state where they are already joined with the cover member 30.

In the preferred embodiment appearing in FIG. 6, although three fastener holes 30d and fastener lock holes 16d are shown for the insertion of fasteners 32, this embodiment can be formed having only one fastener 32 in the center, or two fasteners 32 on opposing sides of the cover member 30.

Figure 7:
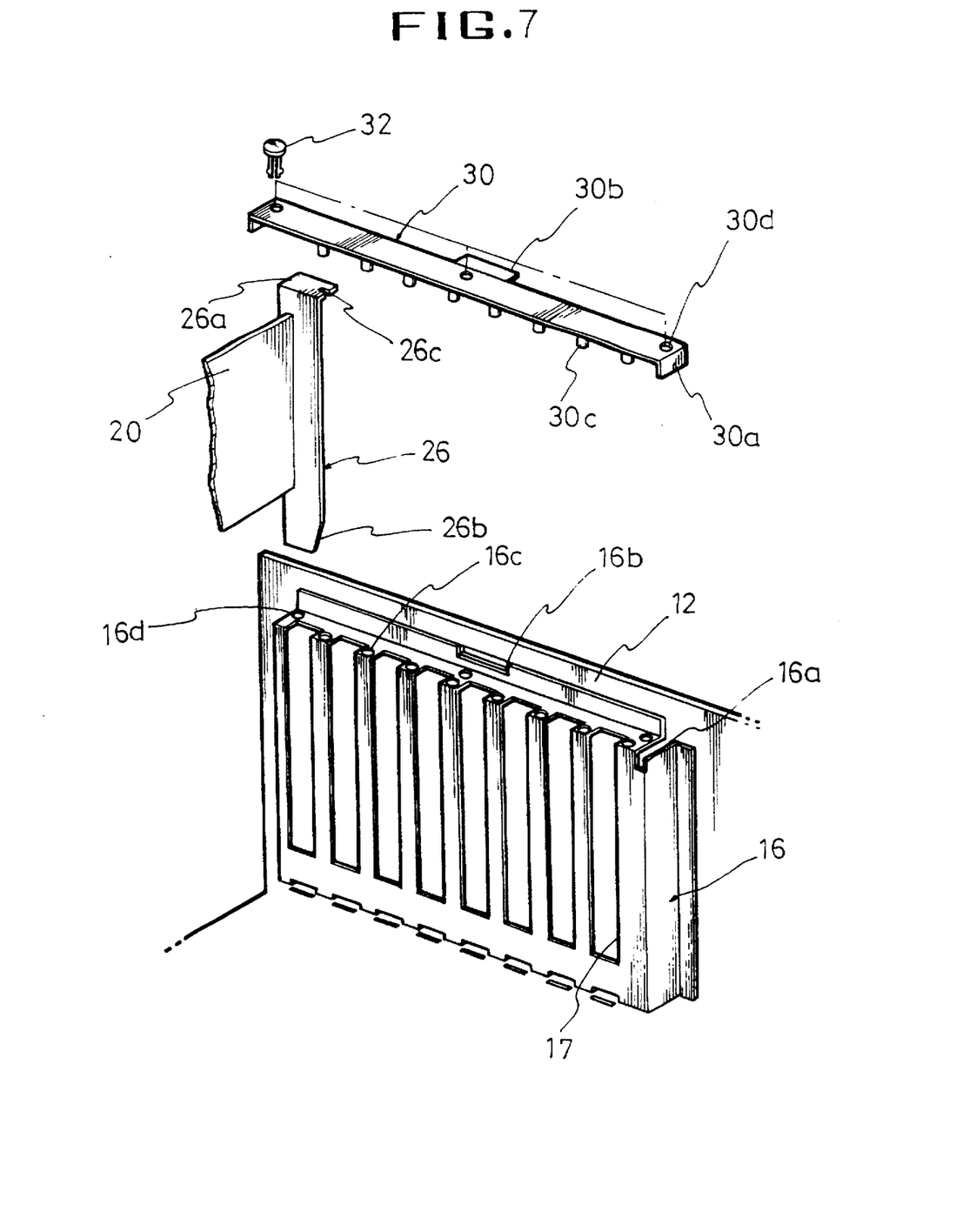
FIG. 7 is a partial assembly perspective view illustrating an expansion board mounting structure for computers according to the fourth embodiment of the present invention.
Figure 8:
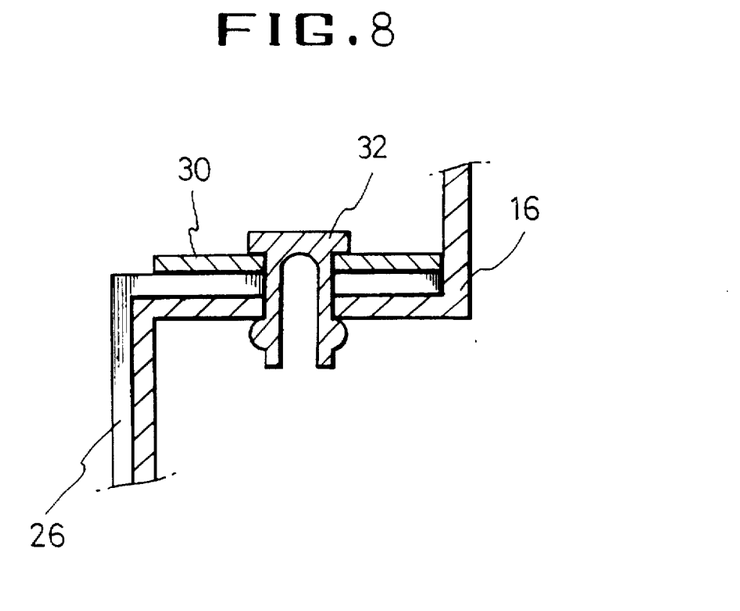
FIG. 8 is a sectional view illustrating a state where a fastener is joined with a cover member and receptacle as is used in the third and the fourth embodiments of the present invention.

FIG. 7 illustrates an expansion board mounting structure according to the fourth embodiment of the present invention. The fourth embodiment is a combination of the second and the third embodiments shown in FIGS. 5 and 6 respectively. Namely, a plurality of fixing protrusions 30c and one or more fastener hole 30d are formed in the cover member 30, a support member groove 26c is formed in the support member 26, and a plurality of protrusion holes 16c and one or more fastener lock holes 16d are formed in the receptacle 16.

The following is the method of mounting an expansion plate to the main body having the expansion plate mounting structure for computers of the present invention structured as in the above. First, the support member 26 is joined to the expansion board 20 through the board joining parts 26d (companies manufacturing expansion boards generally offer the support member and expansion board in a joined state). Next, the end portion 26b of the support member 26 is inserted in the guide groove of the receptacle 16, and the lead end portion 22 is inserted in the board contact part 14, making sure that the two are accurately aligned. After this step, the cover member 30 is joined with the receptacle 16, fully mounting the expansion board 20 to the computer main body 10. Here, by the insertion of the protrusion 30b of the cover member 30 into the receptacle aperture 16b of the receptacle 16, the cover member 30 and receptacle 16 come to be uniformly joined.

As in the above, if the cover member 30 is joined to the receptacle 16, as the side plates 30a, having elasticity, press against the receptacle 16, the expansion board 20 is securely fastened to the receptacle 16, installed in the main body 10, and to the board connecting part 14. In addition, the expansion board 20 and main board 11 are electrically connected through the lead end portion 22 and the board connecting part 14. Furthermore, when a plurality of fixing protrusions 30c are formed on the cover member 30 and protrusion holes 16c in the receptacle 16, the expansion board 20 is joined even more securely to the main body 10 by the insertion of each of the fixing protrusions 30c in the protrusion holes 16c. Moreover, when one or more fastener 32 having elasticity is formed on the cover member 30 and fixing lock holes 16d are formed in the receptacle 16, the expansion board 20 is secured more firmly to the main body 10 by the insertion of the fasteners 32 in the fixing lock holes 16d.

Additionally, when the fixing protrusions 30c are formed on and fasteners 32 are inserted in the cover member 30, and protrusion holes 16c and fixing lock holes 16d are formed on the receptacle 16, the expansion board 20 is joined in an even more secure fashion by the insertion of the fixing protrusions 30c and fasteners 32 in the protrusion holes 16c and fixing lock holes 16d, respectively.

The separation of the expansion board 20 joined to the main body 10 as in the above is accomplished by removing the cover member 30 from the receptacle 16, then by separating the lead end portion 22 of the expansion board 20 from the board connecting part 14. For each of the four embodiments shown above, screws or threaded fasteners are not used to attach cover member 30 to receptacle 16.

While this invention has been described in connection with what is presently considered to be the most practical and preferred embodiment, it is to be understood that the invention is not limited to the disclosed embodiments, but, on the contrary, it is intended to cover various modifications and equivalent arrangements included within the spirit and scope of the appended claims.

What is claimed is:

1. An expansion board mounting structure, comprising:

a main body having a rear panel, a front panel, and a bottom panel;

a receptacle, installed on said rear panel, said receptacle having a plurality of guide grooves;

a plurality of sockets, each bearing a plurality of electrical leads, installed on said bottom panel and electrically connected to a main board by a bus;

an expansion board, said expansion board having a first end portion bearing a plurality of electrical leads joined and electrically connected with corresponding electrical conductors of one of said plurality of sockets;

a plurality of supports, each one of said plurality of supports joining a different one of said expansion board to said receptacle; and a cover member, joined with the receptacle and securing said expansion board to said main body, said cover member being attached to said receptacle without the use of screws or threaded fasteners, said cover member further comprising:

a first end and a second end, and a center portion;

a side plate positioned at said first end and at said second end, said cover member possessing a fixed amount of elastic tension when said side plates are squeezed towards each other; and a protrusion formed at said center portion for being joined to said receptacle of said support.

2. The expansion board mounting structure of claim 1, said cover member has a protrusion formed in said center portion extending perpendicular to the length of the cover member.

3. The expansion board mounting structure of claim 1, insertion grooves are formed in the receptacle for the insertion of the two side plates of the cover member.

4. The expansion board mounting structure of claim 1, a protrusion aperture is formed in the receptacle to accommodate insertion of said protrusion.

5. An expansion board mounting structure, comprising:

a main body having a rear panel, a front panel, and a bottom panel;

a receptacle, installed on said rear panel, said receptacle having a plurality of guide grooves;

a plurality of sockets, each bearing a plurality of electrical leads, installed on said bottom panel and electrically connected to a main board by a bus;

an expansion board, said expansion board having a first end portion bearing a plurality of electrical leads joined and electrically connected with corresponding electrical conductors of one of said plurality of sockets;

a plurality of supports, each one of said plurality of supports joining a different one of said expansion board to said receptacle; and a cover member, joined with the receptacle and securing said at least one expansion board to said main body, said cover member being attached to said receptacle without the use of screws or threaded fasteners wherein a plurality of fixing protrusions formed on the cover member and a plurality of protrusion holes formed in said receptacle to accommodate for the insertion of said fixing protrusions.

6. The expansion board mounting structure for computers of claim 5, further comprising:

at least one fastener;

at least one fastener lock hole formed in said receptacle that accommodates the insertion of said fastener; and at least one fastener hole formed in said cover, said fastener attaching said cover to said receptacle.

7. An expansion board mounting structure, comprising:

a main body having a rear panel, a front panel, and a bottom panel;

a receptacle, installed on said rear panel, said receptacle having a plurality of guide grooves;

a plurality of sockets, each bearing a plurality of electrical leads, installed on said bottom panel and electrically connected to a main board by a bus;

an expansion board, said expansion board having a first end portion bearing a plurality of electrical leads joined and electrically connected with corresponding electrical conductors of one of said plurality of sockets;

a plurality of supports, each one of said plurality of supports joining a different one of said expansion board to said receptacle;

a cover member, joined with the receptacle and securing said at least one expansion board to said main body, said cover member being attached to said receptacle without the use of screws or threaded fasteners;

at least one fastener;

at least one fastener lock hole formed in said receptacle that accommodates the insertion of said fastener; and at least one fastener hole formed in said cover, said fastener attaching said cover to said receptacle.

8. The expansion board mounting structure for computers of claim 7, wherein the fastener includes a head portion formed for easy grasping, an insertion portion for insertion into the fastener holes of the cover member and into the fastener lock holes of the receptacle, and a fixing portion, formed on the lower part of the insertion portion and projecting outward in a half circle for maintaining a secure fixed position in the fastener lock holes.

9. An expansion board mounting structure, comprising:

a main body having a front end, a back end, and a bottom end, each said front end, said back end, and said bottom end having an interior side and an exterior side;

a receptacle mounted on said interior side of said back end of said main body, said receptacle having a top side, said receptacle containing a plurality of guide grooves, each oriented in a vertical direction and each having a top portion and a bottom portion;

a plurality of sockets mounted on said interior side of said bottom end of said main body;

a plurality of inserts, each slidably inserted into said top portion of each one of said vertical guide grooves of said receptacle;

a plurality of expansion printed circuit boards, each having a top portion, a bottom portion, a back portion, and a front portion, said bottom portion being electrically connected to one of said plurality of sockets, said back portion connected to one of said plurality of inserts; and a cover member having a first end, a second end, a center portion between said first end and said second end, said cover member having a top, a bottom, a front, and a back side, said cover member fixedly attaches to said top side of said receptacle preventing said expansion boards connected to said inserts from moving in a vertical direction, said cover member fastens to said receptacle by:

a protrusion on said center portion of said back side of said cover member that mates with an aperture on said top side of said receptacle; and metal tabs on said first end and said second end of said cover member that fit into slots on said top side of said receptacle, firmly attaching said cover member to said receptacle.

10. The expansion board mounting structure of claim 9, further comprising:

a plurality of protrusions extending from said bottom side of said cover member; and a plurality of apertures formed on said top side of said receptacle between said guide grooves, said apertures accommodate said protrusions extending from said bottom side of said cover unit.

11. The expansion board mounting structure of claim 9, said cover member and said top side of said receptacle perforated by at least one hole for accommodating a fastener to fasten said cover member to said receptacle.

12. The expansion board mounting structure of claim 10, said cover member and said top side of said receptacle perforated by at least one hole for accommodating a fastener to fasten said cover member to said receptacle.

13. The expansion board mounting structure of claim 12, said fastener having a head portion, an insertion portion, and a retaining portion on said insertion portion.

14. The method of attaching an expansion printed circuit board to a motherboard inside a computer chassis, comprising:

attaching a receptacle insert part to said expansion board via threaded fasteners;

inserting said receptacle insert part with said expansion board attached into a groove formed in a receptacle that is attached to said computer chassis;

inserting a lead end portion of said expansion printed circuit board into a board contact part, forming an electrical connection to said expansion printed circuit board; and joining a cover member to said receptacle, thus securing said expansion printed circuit board to said computer chassis, said joining said cover member to said receptacle comprises:

inserting a protrusion formed on the back side of the center portion of said cover member into an aperture on a top side of said receptacle; and inserting metal tabs formed on each end of said cover member into slots formed on each end of said top side of said receptacle.

15. The attachment method of claim 14, said joining said cover to said receptacle further comprises inserting a plurality of protrusions extending from a bottom side of said cover member into a plurality of apertures formed on said top side of said receptacle between said guide grooves, further securing said expansion printed circuit board to said computer chassis.

16. The attachment method of claim 14, said joining said cover to said receptacle further comprises inserting flexible fasteners into apertures perforating said cover member and into apertures perforating said top side of said receptacle, further securing said expansion printed circuit board to said computer chassis.

17. The attachment method of claim 15, said joining said cover to said receptacle further comprises inserting flexible fasteners into apertures perforating said cover member and into apertures perforating said top side of said receptacle, further securing said expansion printed circuit board to said computer chassis.

* * * * *